United States Patent [19]

Chen et al.

[11] Patent Number: 5,783,366
[45] Date of Patent: Jul. 21, 1998

[54] METHOD FOR ELIMINATING CHARGING OF PHOTORESIST ON SPECIMENS DURING SCANNING ELECTRON MICROSCOPE EXAMINATION

[75] Inventors: Hsin-Pai Chen; Dong-Shiuh Cheng, both of Hsin-chu, Taiwan

[73] Assignee: Taiwan Semiconductor Manufacturing Company Ltd., Hsin-Chu, Taiwan

[21] Appl. No.: 568,721

[22] Filed: Dec. 7, 1995

[51] Int. Cl.$^6$ .................................................. G03C 5/00
[52] U.S. Cl. ........................ 430/311; 430/313; 430/315; 438/14
[58] Field of Search ..................... 156/626.1, 644.1, 156/657.1, 659.11; 437/8, 235; 430/313, 315, 311; 438/14

[56] References Cited

U.S. PATENT DOCUMENTS

| | | | |
|---|---|---|---|
| 3,901,738 | 8/1975 | Hunsperger et al. | 148/1.5 |
| 3,920,483 | 11/1975 | Johnson, Jr. et al. | 148/1.5 |
| 4,160,987 | 7/1979 | Dennard et al. | 357/41 |
| 4,337,115 | 6/1982 | Ikeda et al. | 156/659.1 |
| 4,693,782 | 9/1987 | Kikuchi et al. | 156/653 |
| 5,081,515 | 1/1992 | Murata et al. | 357/42 |
| 5,338,630 | 8/1994 | Yoon et al. | 430/30 |

*Primary Examiner*—M. Nuzzolillo
*Assistant Examiner*—Steven H. Ver Steeg
*Attorney, Agent, or Firm*—George O. Saile; Stephen B. Ackerman

[57] ABSTRACT

A method is described whereby a wafer having a layer of photoresist on its surface, can be subjected to ion implantation just prior to examination by a scanning-electron-microscope(SEM) thereby rendering the photoresist sufficiently conductive that charging of the surface does not occur within the SEM. Accumulation of surface charge on specimens in the SEM causes gross image distortion and obliteration. The technique is particularly useful for inspecting a developed photoresist layer on an insulating layer such as silicon oxide prior to oxide etching. Such is the case when the wafer is being inspected for photoresist quality and pattern dimensions prior to contact opening. The resist mask is developed and subjected to a low dosage ion implant. Images are rendered crisp and clear allowing for accurate measurements. The ability to test the photo pattern at this point is cost effective in that it permits the option of photoresist re-work, and lessens the need for a post-etch inspection.

13 Claims, 2 Drawing Sheets

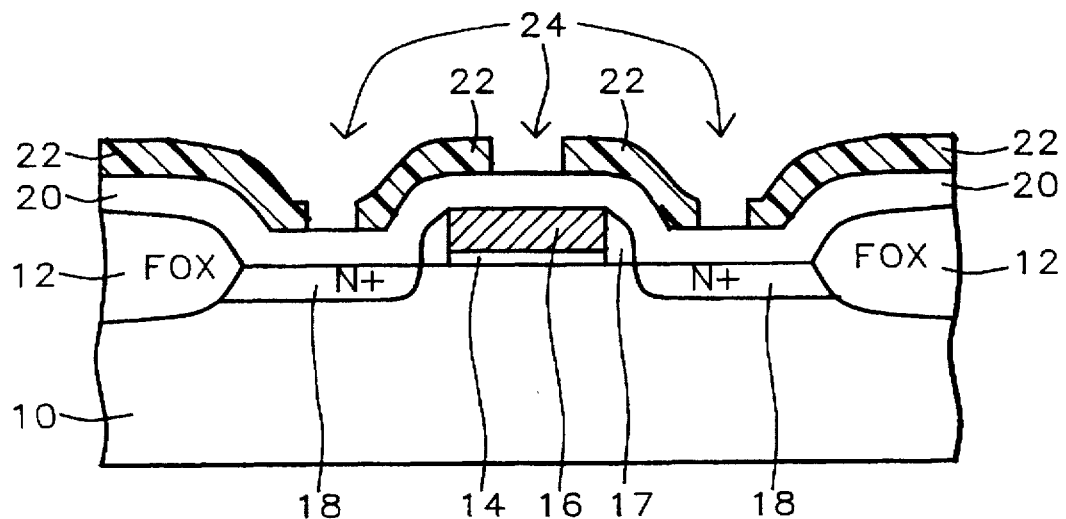
FIG. 1
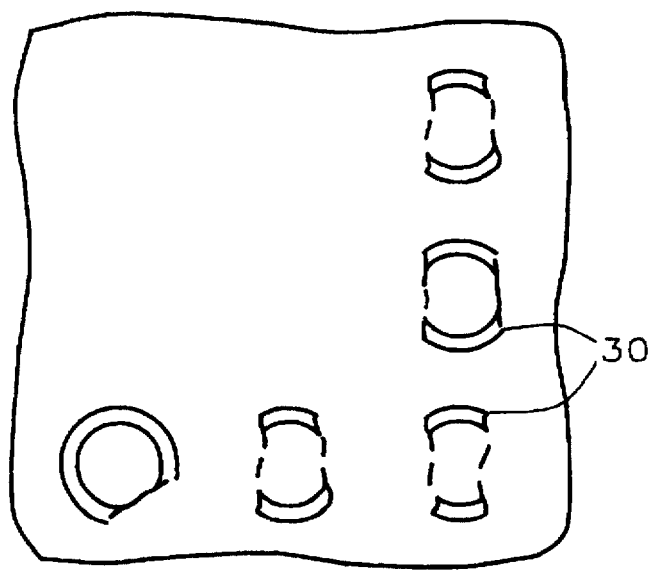
FIG. 2 - Prior Art

METHOD FOR ELIMINATING CHARGING OF PHOTORESIST ON SPECIMENS DURING SCANNING ELECTRON MICROSCOPE EXAMINATION

BACKGROUND OF THE INVENTION (1) Field of the Invention

This invention relates to monitoring and diagnostics of line processes used for the manufacture of semiconductor devices and more particularly to the measurement of critical dimensions of photoresist patterns by scanning electron microscopy prior to contact hole etching.

(2) Description of Prior Art

In the fabrication of integrated circuits, electrical connections to the various devices are made by first depositing an insulating layer such as silicon oxide over the surface and then etching holes through oxide over the devices. For MOSFETS the contacts are made to source, drain, and gate while in bipolar transistors, emitter, collector, and base contacts must be formed. Other types of contacts such as to diodes and even to the substrate itself are required. The oxide is patterned using standard photoresist processes. Once the photoresist is developed it is desirable to measure the critical dimensions of the pattern openings as well as to verify their integrity before the oxide pattern is etched. Because they occur at the first tier of metallization, the dimensions of the contacts are usually the tiniest and most critical features of the integrated circuit's interconnection metallurgy.

The scanning electron microscope(SEM) has become a most valuable tool for examining and measuring patterns of these dimensions which are in the micron to sub-micron range. Optical microscopy, even with the finest available microscopes, cannot resolve these images with sufficient accuracy to permit reliable measurements. Many times the objects can be discerned, but measurements to the accuracies required are not possible. The SEM permits such precise measurements to a remarkable degree and, as such as, has become a vital tool for monitoring all facets of integrated circuit device manufacturing. Features such as small pockets of debris in via holes would not be observed by optical microscopy. In the SEM, however, they are revealed with extraordinary crispness and clarity. The principle of the SEM requires placement of the specimen into a vacuum chamber where it is observed by a focused electron beam. The surface of the specimen must be electrically grounded within the system. Otherwise electrons from the beam accumulate on the surface and cause severe distortions of the image. Earlier SEMs could only accept small specimens which were usually mounted onto aluminum pedestals using a conductive silver paste providing a good ground contact. Nevertheless, when the specimens have exposed layers of insulating films such as silicon dioxide or photoresist, local charging of these surfaces occurs, particularly when high beam accelerating voltages are required to obtain sufficient resolution. The result is image distortion as well as obliteration. The problem is avoided on disposable specimens by sputtering a thin layer of gold onto the specimen just prior to insertion into the microscope. This provides a conductive surface, allowing a discharge path to ground without disturbing the features being observed.

Current technology permits larger specimens to be placed into the SEM. Whole wafers taken from a production job may now be examined with the SEM and then re-inserted into the production line for continued processing. Frequently the SEM is used to examine photoresist images to determine if the feature dimensions are within specifications or if any residue or debris has remained in the developed pattern. These wafers can now be inserted into the SEM for routine examination and measurement. However, depositing gold or some other conductive material onto the wafers is no longer an acceptable option if they are to be re-inserted into the production line. Since the conductive coating cannot be applied, the after-development-inspection(ADI) is sketchy because of the charging problems within the SEM. However, this is the only point at which re-work of the photoresist is possible. After the oxide has been etched, the SEM gives better resolution because the open contact holes provide some discharge relief for the charged surface. A second after-etching-inspection(AEI) allows for pass/fail decisions to be made but at this point re-work can no longer be done.

It is the object of this invention to show how the problem of image distortion due to photoresist charging can be overcome by making the resist conductive with ion implantation.

SUMMARY OF THE INVENTION

Accordingly a method for treatment of photoresist layers with ion implantation is described which overcomes the problem of image distortion by photoresist charging during SEM examination. A semiconductor wafer is provided. The wafer has undergone the process steps which have fabricated the various semiconductor devices within it's surface. An insulating layer of silicon oxide is deposited. A layer of photoresist is applied and patterned to define the contacts for the various devices. After the photoresist is developed the wafer is subjected to a low dosage, low energy ion implant. The implant causes the photoresist to become sufficiently conductive to inhibit the charging within the SEM. The entire process is simple, requires only minutes to perform and has no detrimental effects on the underlying components as confirmed by comparative parametric measurements of the integrated circuit devices with and without photoresist implantation. Follow-up testing has shown that the after-etch-inspection(AEI) shows good correlation to the after-development-inspection(ADI). The contact holes can now be clearly seen and accurately measured prior to oxide etching. In addition photoresist residues and debris that would previously have gone undetected are now revealed on time. Wafers that would otherwise have been scraped by the AEI can now be salvaged by rework of the photoresist.

BRIEF DESCRIPTION OF THE DRAWINGS

FIG. 1 is a cross-sectional representation of a self-aligned polysilicon gate MOSFET processed to the point where photoresist has been applied over a silicon oxide layer. The photoresist has been exposed and developed and is ready to be inspected for integrity of the contact openings and any residues from the resist processing.

FIG. 2 is a representation of an SEM photograph of a contact hole pattern in developed photoresist on a monitor wafer with conventional processing. The photoresist is untreated.

DESCRIPTION OF THE PREFERRED EMBODIMENTS

Figure 4:
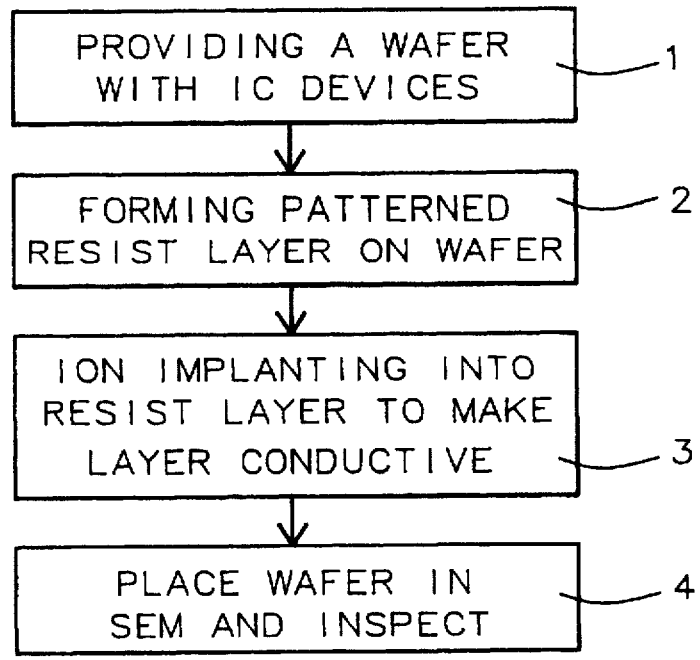
FIG. 4 gives a flow chart of the process of the invention.

Accordingly, in a typical embodiment of this invention a silicon substrate(wafer) is provided. Referring to FIG. 4, the wafer 10, at the insertion of this invention, has been processed in an integrated circuit manufacturing line to a point where the discrete semiconductor devices have been incorporated (FIG. 4-1). In this example, the circuit element consists of a MOSFET (FIG. 1). The gate oxide 14 has been grown and covered with a polysilicon gate electrode 16. The polysilicon has been doped by ion implantation using phosphorous. The Source and drain 18 have been formed by arsenic implantation into areas between the field oxide 12 and the gate sidewalls 17. A layer of insulating material, for example silicon oxide 20 has been deposited over the surface into which the contact holes will be etched. Other insulating materials for example, silicon nitride, phosphosilicate glass, and borophosphosilicate glass could be used as well. A layer photoresist 22, has been applied and patterned with openings 24 for the contact holes (FIG. 4-2).

Figure 3:
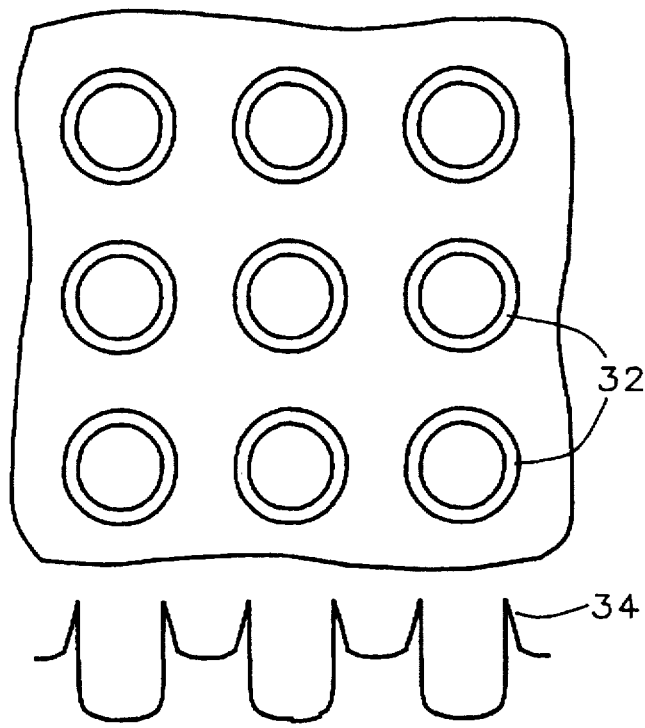
FIG. 3 is a similar view as FIG. 1 except that the photoresist on the wafer has been ion implanted.

The next step consists of an inspection of the openings in the photoresist to verify the critical dimensions of the openings as well as to ascertain their uniformity and the absence of any residues from the photoresist development. Because of their sub-micron size, the SEM is required to make this inspection. The wafer to be inspected is first ion implanted with arsenic at a dose of $10^{13}$ to $10^{15}$ atoms/cm$^2$ with an energy of 50 to 70 keV (FIG. 4-3). Alternatively ions of boron, phosphorous, and $BF_2^+$ could be implanted. This implantation makes the photoresist layer sufficiently conductive to inhibit surface charge accumulation during the SEM inspection. The penetration of dopant in the resist or in the oxide openings at these energies is less than 500 Angstroms. Following implantation, the wafer is mounted in the SEM and inspected (FIG. 4-4). The SEM inspection consists of measuring dimensions of patterns in the photoresist mask and identifying residues, debris, and scum left by photoresist processing. FIG. 2 depicts an SEM image without implanted photoresist. The charging of the photoresist surface by the electron beam not only distorts the images 30 but obliterates them completely in the center of the view thus rendering the SEM measurement practically useless. The outlines 30 are actually faint and diffuse. The image of a wafer with a photoresist layer implanted in the manner of this invention is shown in FIG. 3. The undistorted detail and clarity shown here 32 is only possible in the absence of accumulated charge. The secondary electron signal 34 reflects the uniformity of the pattern.

Measurements of the critical dimensions made from these images are reliable and the need for an additional inspection after the oxide openings have been etched is lessened. If debris is found in these images, or if the measured dimensions do not meet specifications, the resist is stripped, re-applied, re-implanted, and re-inspected thereby salvaging the wafer.

After the quality of the photoresist has been verified by this inspection, the contact openings are made in the oxide layer 20 by subjecting the wafer to reactive-ion-etching (RIE) using a fluorocarbon etchant gas such as CF, under etching conditions that provide a high silicon oxide-to-silicon etch rate ratio. These procedures are well known to those skilled in the art of RIE. The photoresist, along with it's implanted arsenic is then stripped away using conventional solvents and the wafer continues processing in the regular manner.

While this invention has been particularly shown and described with reference to the preferred embodiments thereof, it will be understood by those skilled in the art that various changes in form and details may be made without departing from the spirit and scope of the invention.

In general, this invention could be applied to other situations where photoresist layers need to be inspected by scanning-electron-microscopy. It is particularly beneficial when the photoresist is used to pattern an insulating layer.

What is claimed is:

1. A method for preparing a semiconductor wafer, having integrated circuit devices and an insulative layer with a photoresist mask thereon, for examination using a scanning electron microscope(SEM) without compromising said wafer for further processing and without accumulation of surface charge during SEM examination comprising:

providing a semiconductor wafer having integrated circuit devices, and an insulative layer with a photoresist mask thereon;

making said photoresist mask conductive by implanting ions into its surface, and mounting said wafer onto the specimen holder of an SEM.

2. The method of claim 1 wherein said photoresist mask defines contact openings to said integrated circuit devices which are to be etched in said insulative layer.

3. The method of claim 1 wherein said insulative layer is selected from the group consisting of silicon oxide, silicon nitride, phosphosilicate glass, and borophosphosilicate glass.

4. The method of claim 1 wherein said ions are selected from the group consisting of arsenic phosphorous and $BF_2^+$.

5. The method of claim 1 wherein said ions are implanted at a dose of between about $10^{13}$ and $10^{15}$ atoms/cm$^2$.

6. The method of claim 1 wherein said ions are implanted at an energy of between about 50 and 70 keV.

7. A method for examining a semiconductor wafer, having integrated circuit devices and an insulative layer with a photoresist mask thereon, using a scanning electron microscope(SEM) without occurrence of surface charge accumulation during SEM examination comprising providing a semiconductor wafer having integrated circuit devices, and an insulation layer with a photoresist mask thereon, making said photoresist mask conductive by implanting ions into its surface, mounting said wafer on the specimen holder of an SEM;

placing said mounted wafer into the specimen chamber of an SEM; and examining said wafer.

8. The method of claim 7 wherein said photoresist mask defines contact openings to said integrated circuit devices which are to be etched in said insulative layer.

9. The method of claim 7 wherein said insulative layer is selected from the group consisting of silicon oxide silicon nitride, phosphosilicate glass, and borophosphosilicate glass.

10. The method of claim 7 wherein said ions are selected from the group consisting of arsenic, phosphorous, and $BF_2^+$.

11. The method of claim 7 wherein said ions are implanted at a dose of between about $10^{13}$ and $10^{15}$ atoms/cm$^2$.

12. The method of claim 7 wherein said ions are implanted at an energy of between about 50 and 70 keV.

13. The method of claim 7 wherein examining said wafer consists of measuring dimensions of patterns in said photoresist mask and identifying residues, debris, and scum left by photoresist processing.

* * * * *